(12) United States Patent
Gohara et al.

(10) Patent No.: US 6,441,604 B1
(45) Date of Patent: Aug. 27, 2002

(54) APPARATUS AND METHOD FOR SENSING ELECTRIC CURRENT BASED ON ELECTRIC SIGNAL FROM MAGNETO-ELECTRIC CONVERSION ELEMENT

(75) Inventors: Takashi Gohara; Yoshinori Ikuta; Yasuhiro Tamai; Mitsuaki Morimoto, all of Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 19 days.

(21) Appl. No.: 09/642,098

(22) Filed: Aug. 21, 2000

(30) Foreign Application Priority Data

Aug. 20, 1999 (JP) .......................................... 11-234743

(51) Int. Cl.[7] .............................................. G01R 33/12
(52) U.S. Cl. ............................... 324/117 R; 324/117 H; 324/235
(58) Field of Search ........................ 324/117 H, 117 R, 324/251, 127, 235, 225, 207.13, 207.12

(56) References Cited

U.S. PATENT DOCUMENTS 4,021,728 A * 5/1977 Makino et al. ............. 324/235
4,887,027 A * 12/1989 Strasser ................... 324/117 H
5,880,586 A * 3/1999 Dukart et al. ............. 324/207.2

FOREIGN PATENT DOCUMENTS

JP 62-98267 5/1987

* cited by examiner

*Primary Examiner*—N. Le
*Assistant Examiner*—Vincent Q. Nguyen
(74) *Attorney, Agent, or Firm*—Finnegan, Henderson, Farabow, Garrett & Dunner, L.L.P.

(57) ABSTRACT

An electric current sensor for sensing an electric current flowing through a conductor comprises a single hall element having a magnetic-flux sensitive surface, and an angle adjusting mechanism. The angle adjusting mechanism changes an angle between the magnetic-flux sensitive surface and the direction of a magnetic flux induced by the electric current flowing through the conductor. The magneto-electric conversion element outputs an electric signal in response to a magnetic flux density at the magnetic-flux sensitive surface. The electric current sensor detects the electric current flowing through the conductor based on the electric signal output from the magneto-electric conversion element whose magnetic-flux sensitive surface is oriented with respect to the magnetic flux at a selected angle.

9 Claims, 7 Drawing Sheets

APPARATUS AND METHOD FOR SENSING ELECTRIC CURRENT BASED ON ELECTRIC SIGNAL FROM MAGNETO-ELECTRIC CONVERSION ELEMENT

The present patent application claims the benefit of earlier Japanese Patent Application No. H11-234743 filed Aug. 20, 1999, the disclosure of which is entirely incorporated herein by reference.

BACKGROUND OF THE INVENTION

1. Field of the Invention

This invention relates to an apparatus and a method for sensing an electric current flowing through an electric circuit assembled into various instruments and devices of, for example, an automobile, and particularly to an apparatus and a method for sensing an electric current using a magneto-electric conversion element.

2. Description of the Related Art

Electric current sensors for sensing an electric current using hall elements are conventionally known. Hall element is a type of magneto-electric conversion elements. One example of such electric current sensors is disclosed in Japanese Patent Application Laid-open No.62-98267.

Figure 1A:
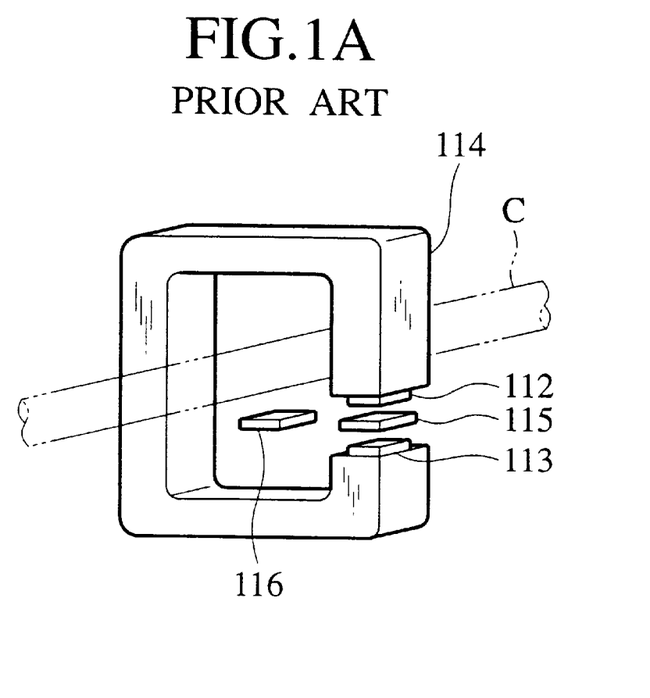
FIG. 1 illustrates a prior art electric-current sensor using two or more hall elements.
Figure 1B:
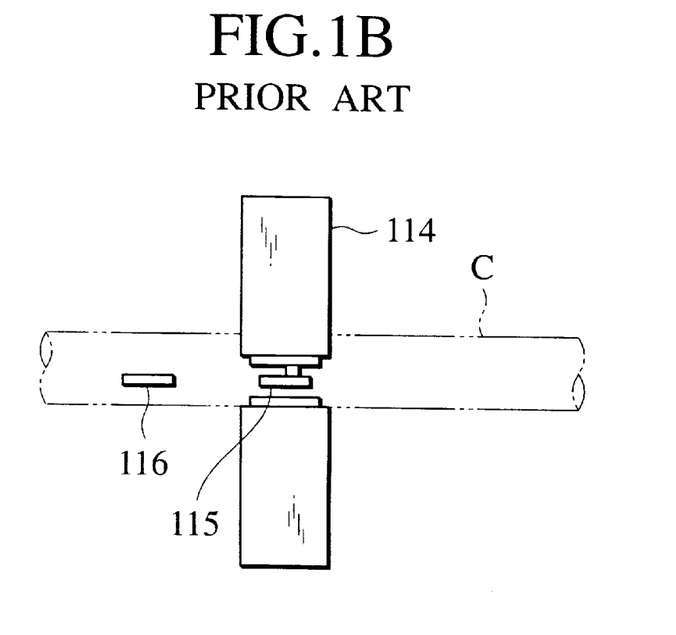

FIG. 1 illustrates the electric-current sensor disclosed in 62-98267. A first hall element 115 is placed in the gap defined by the two end faces 112 and 113 of the C-shaped magnet 114. A conductor C extends perpendicular to the plane defined by the C-shaped magnet 114. The first hall element 115 is placed so that its magnetism-sensitive surface is perpendicular to the magnetic field created by the magnet 114. The first hall element 115 produces an electromotive force in response to a small amount of electric current flowing through the conductor C.

A second hall element 116 is placed apart from the magnet 114 at a predetermined distance and adjacent to the conductor C, with its magnetism-sensitive surface is perpendicular to a magnetic field induced by the electric current flowing through the conductor C. In other words, the second hall element 116 feels the magnetic field induced by the electric current, but is not so affected by the magnetic field produced by the magnet 114 as the first hall element 115.

An electromotive force becomes large as an electric current increases as long as magnetic flux is not saturated. Accordingly, with this electric current sensor, if the electric current flowing through the conductor C is small, the first hall element 115 is used. If the electromotive force of the first hall element 115 is being saturated, then, the electromotive force of the second hall element 116 is used to detect the electric current. This arrangement improves the accuracy of the sensing ability, and at the same time, increases the range of detection.

Figure 2:
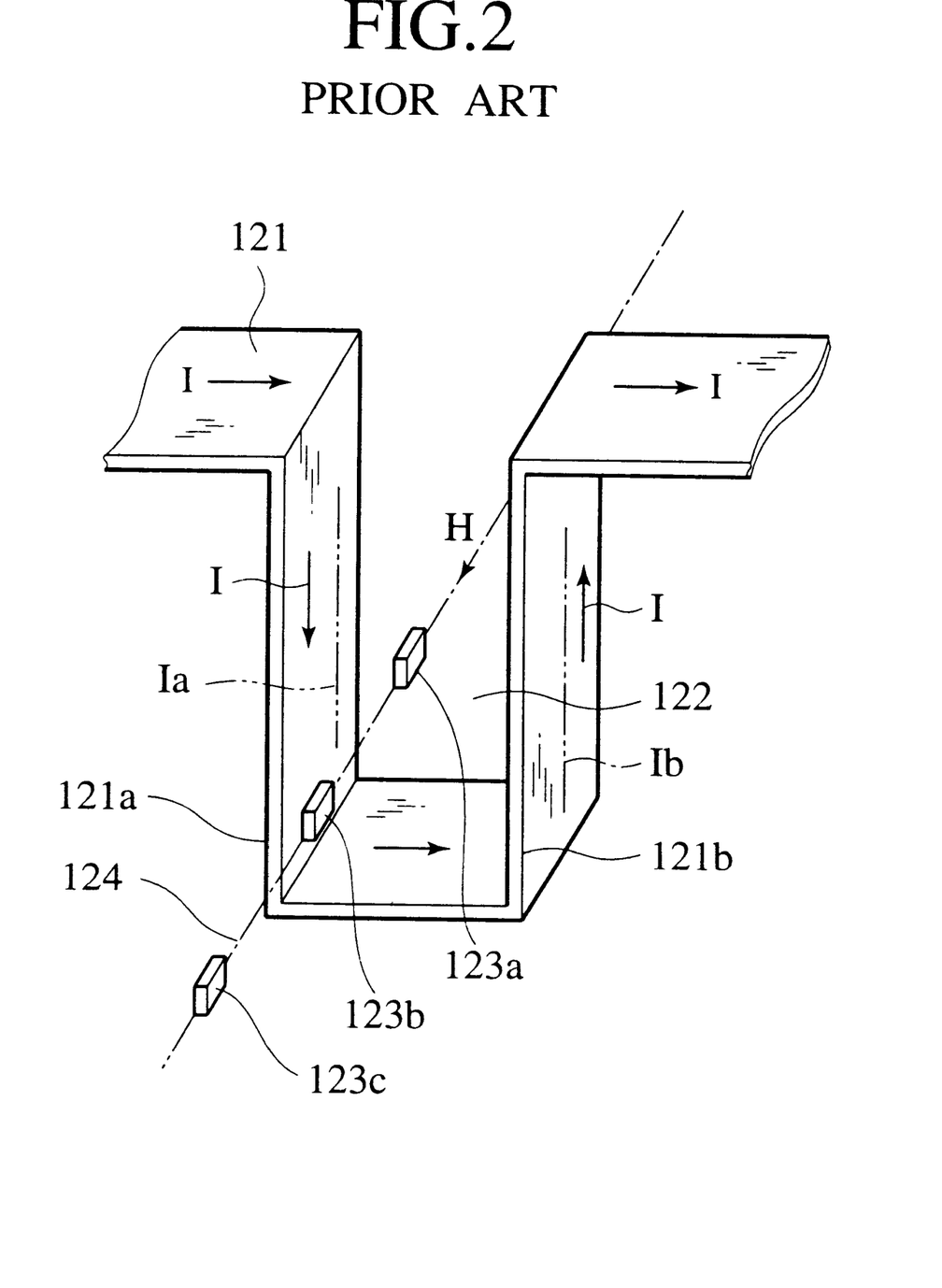
FIG. 2 illustrates another type of prior art electric-current sensor using two or more hall elements.

FIG. 2 illustrates another prior art technique, which is an electric current sensor disclosed in Japanese Patent Application Laid-open No. 8-194016. A busbar 121 is bent into a U-shape to form a return conductor 122. The return conductor 122 has legs 121a and 121b, each of which has a center line that is coincident with one of the current center lines Ia and Ib. Magnetic sensors 123a, 123b, and 123c are arranged along a line 124 which is perpendicular to a plane that contain the current center lines Ia and Ib and passes in the middle between the legs 121a and 121b. The distances from the return conductor 122 to the three magnetic sensors 123a, 123b, and 123c are different.

The outputs of the magnetic sensors 123a, 123b, and 123c are saturated if the intensity of a magnetic field exceeds a predetermined value. The magnetic field induced by the electric current I flowing through the return conductor 122 is sensed by one of the magnetic sensors 123a, 123b, and 123c. If a small quantity of electric current flows through the return conductor 122, the magnetic sensor 123a positioned closest to the legs 121a and 121b is used to detect the electric current. To measure a large quantity of electric current, the magnetic sensor 123c remote from the legs 121a and 121b is used. With this arrangement, the intensity of the magnetic field can be measured in an appropriate range, regardless of the level of the electric current being measured.

Both types of electric current sensors disclosed in 62-98267 and H8-194016 148 improve the resolution of current measurement and broaden the range of the measurable current. However, both require two or more magneto-electric conversion elements (i.e., hall elements), which causes the manufacturing cost for a current sensor to be high.

In addition, the solid properties, such as a temperature property, a sensitiveness property, an offset-drift property, and so on, of magneto-electric conversion elements vary from one another, and such variations have to be corrected in actual use.

Furthermore, both types of current sensors require a signal selector for selecting one of signals supplied from the multiple magneto-electric conversion elements. This requirement inevitably makes the hardware scale of the electric-current sensor large.

SUMMARY OF THE INVENTION

Therefore, it is an object of the invention to overcome these problems in the prior art, and to provide an apparatus and a method for sensing a broad range of electric current at a high precession and a low cost, using a single magneto-electric conversion element.

In order to achieve the object, in one aspect of the invention, an electric current sensor detects an electric current flowing through a conductor, making use of magnetic flux induced about the conductor by the electric current flowing through the conductor. The electric current sensor comprises a single magneto-electric conversion element having a magnetic-flux sensitive surface, and an angle adjusting mechanism for changing the angle between the magnetic-flux sensitive surface of the magneto-electric conversion element and the direction of the magnetic flux induced by the electric current. The magneto-electric conversion element is, for example, a hall element, which outputs an electric signal in response to the magnetic flux density at the magnetic-flux sensitive surface. The electric current sensor detects the electric current flowing through the conductor based on the electric signal output from the magneto-electric conversion element whose magnetic-flux sensitive surface is oriented with respect to the magnetic flux at a selected angle.

The electric current sensor has a junction box for accommodating a portion of the conductor and having a hole on one face, and a cock fit into the hole in a removable manner. The cock supports the magneto-electric conversion element, and the magneto-electric conversion element is placed inside the junction box when the cock is fit into the hole of the junction box. The cock is rotated with respect to the hole of the junction box. The circumference of the hole and the periphery of the cock constitute the angle adjusting mechanism.

Preferably, the hole has a plurality of recesses at a predetermined interval around the circumference. Each recess extends in the radial direction from the circumference of the hole so as to define a contour of gear teeth. The cock has a plurality of teeth at a predetermined interval along its periphery. In this case, the angle adjusting mechanism comprises the teeth of the cock and the recesses of the hole, which are meshed with and disengaged from each other.

Alternatively, the hole has an internal thread, and the cock has an external thread. In this case, the angle adjusting mechanism comprises the external thread of the cock and the internal thread of the hole.

In another aspect of the invention, an electric current sensor for sensing an electric current flowing through a conductor comprises a clipping frame having a slit and two wings separated by the slit. The conductor is inserted in the slit and clipped by the two wings of the clipping frame. In this state, if the electric current flows through the conductor, a magnetic flux is induced about the conductor. A pair of hall elements is placed inside the respective wings of the clipping frame, each hall element having a magnetic-flux sensitive surface. The electric current sensor also includes an angle adjusting mechanism for changing the angle of the magnetic-flux sensitive surface of the hall element with respect to the direction of the magnetic flux.

Preferably, a pair of angle-adjusting projections is formed in the inner faces of the slit, and multiple angle-adjusting holes are formed in the conductor at a predetermined interval along an arch. When the electric current sensor is attached to the conductor, the pair of angle-adjusting projections are fit into one of the angle-adjusting holes. In this case, the pair of angle-adjusting projections and the plurality of holes constitute the angle adjusting mechanism.

Alternatively, a pair of angle-adjusting recesses is formed in the inner faces of the slit, and multiple angle-adjusting projections are formed in the conductor at a predetermined interval along an arch. When the electric current sensor is attached to the conductor, the pair of angle-adjusting projections are fit into one of the angle-adjusting holes. In this case, the pair of angle-adjusting projections and the plurality of holes constitute the and adjusting mechanism.

Alternatively, a pair of angle-adjusting recesses is formed in the inner faces of the slit, and multiple angle-adjusting projections are formed on the conductor at a predetermined interval along an arch. One of the angle-adjusting projections is fit into the angle-adjusting recesses when the electric current sensor is attached to the conductor. IN this case, the pair of angle-adjusting recesses and the plurality of angle-adjusting projection the angle adjusting mechanism.

In still another aspect of the invention, a method for sensing an electric current flowing through a conductor is provided. The electric current flowing through the conductor induces a magnetic flux about the conductor. With the method, first, a magneto-electric conversion having a magnetic-flux sensitive surface is placed in the magnetic field. Then, the orientation of the magnetic-flux sensitive surface is oriented with respect to the direction of the magnetic flux. The magneto-electric conversion element is caused to output an electric signal in response to a magnetic flux density at the magnetic-flux sensitive surface. Finally, the electric current flowing through the conductor is measured based on the electric signal output from the magneto-electric conversion element.

BRIEF DESCRIPTION OF THE DRAWINGS

Other objects, features, and advantages of the invention will be apparent from the following detailed description in conjunction with the attached drawings in which:

FIG. 5 illustrates an electric-current sensor according to the third embodiment of the invention, in which

FIG. 6 illustrates how the electric-current sensor shown in FIG. 5 is used to detect an electric, in which

DETAILED DESCRIPTION OF THE INVENTION

First Embodiment

The invention will now be described in detail in conjunction with the attached drawings.

FIGS. 3 illustrates the overall structure of an electric-current sensor 300 according to the first embodiment of the invention. The electric-current sensor 300 comprises a belt-like conductor 10, and a junction box 20 that accommodates a portion of the belt-like conductor 10. The junction box 20 is, for example, a hexahedral box. The conductor 10 penetrates through the junction box 20 near the bottom of two opposite side faces.

A gear-shaped round hole 21 is formed on the top face of the junction box 20. The hole 21 has multiple recesses 22 along its circumference. The hole 21 is designed so as to receive a gear-shaped cock 40. A hall element 30 hangs down from the gear-shaped cock 40. A prescribed quantity of electric current is supplied to the hall element 30 via leads 31. When the cock 40 is fit into the hole 21, the hall element is placed inside the junction box 20. In the example shown in FIG. 3, the number of the teeth of the cock 40 and the number of the recesses 22 around the hole 21 is eight.

The hall element 30 is a magneto-electric conversion element having a magnetic-flux sensitive surface. In this example, the magnetic-flux sensitive face is a side face of the hall element, which extends in parallel with the longitudinal axis of the belt-like conductor 10 and perpendicular to the top surface of the belt-like conductor 10. The hall element 30 generates a hall voltage (or a hall signal) in response to the amount of magnetic flux striking the magnetic-flux sensitive surface 30a. The hall signal generated by the hall element 30 is extracted externally via the leads 31 penetrating through the cock 40.

The cock 40 becomes a part of the top face of the junction box 20 when it is fit into the hole 21. To be more precise, the cock 40 is a disc with multiple teeth 41 extending in the radial direction at the top face of the cock 40. The teeth 41 are received in the recesses 22. The recesses 22 and the teeth 41 constitute an angle adjusting mechanism 50.

Figure 3A:
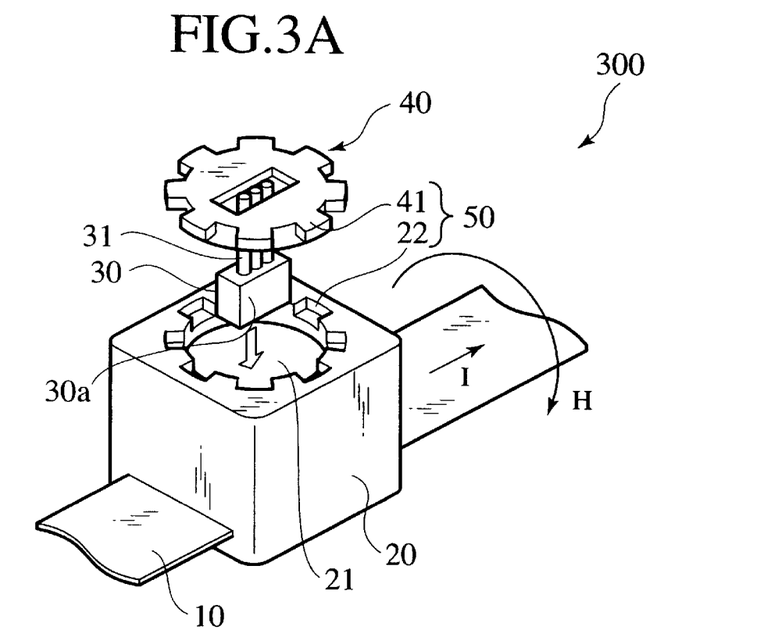
FIG. 3 illustrates in a perspective view of an electric-current sensor according to the first embodiment of the invention.

The principle of the electric-current sensor 300 will now be explained. First, the hall element 30 is placed into the hole 21 so that the longer sides of the hall element align with the longitudinal axis of the belt-like conductor 10, as shown in FIG. 3A. Then, the cock 40 is fit into the hole 21 with the teeth 41 received in the recesses 22. In this state, the magnetic-flux sensitive surface of the hall element 30 is in parallel with the longitudinal axis of the belt-like conductor 10.

If an electric current I flows through the conductor 10 in the direction of the arrow in FIG. 3A, a magnetic field H is produced in accordance with the Ampere's corkscrew rule. The intensity of the magnetic field H is in proportion to the electric current I. As has been mentioned above, the magnetic-flux sensitive surface of the hall element 30 is in parallel with the longitudinal axis of the belt-like conductor, and perpendicular to the top face of the conductor. Therefore, the magnetic flux due to the magnetic field H strikes the magnetic-flux sensitive surface at a normal angle (i.e., at 90 degrees), and a voltage which is proportional to the magnetic flux density B is obtained from the hall element 30.

Figure 3B:
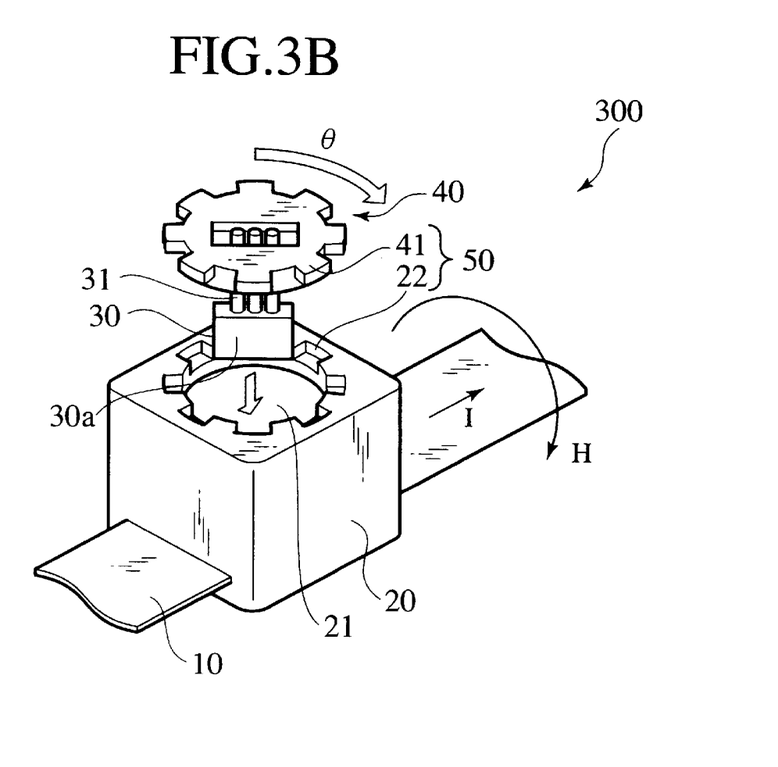

Then, if the quantity of electric current flowing through the conductor 10 is relatively large, the orientation of the hall element 30 will be changed, as shown in FIG. 3B. The cock 40 is removed from the hole 21, and rotated by an angle θ from the state shown in FIG. 3A. The cock 40 is fit into the hole 21 again with the teeth 41 received in the recesses 22. The longer sides of the hall element 30 make an angle θ with respect to the longitudinal axis of the belt-like conductor 10.

The electric current flowing through the belt-like conductor 10 induces an magnetic field H, and magnetic flux density at the surface of the hall element 30 becomes B*cos θ. Accordingly, a voltage or a signal in proportional to the magnetic flux density B*cos θ is obtained from the hall element 30.

With this arrangement, in order to measure a small quantity of electric current flowing through the conductor 10, the cock 40 is fit into the hole 21 of the junction box 20 so that the magnetic-flux sensitive surface of the hall element 30 is perpendicular to the magnetic flux. As the electric current to be measured becomes large, the cock 40 is rotated to make the angle θ larger to adjust the amount of magnetic flux striking the magnetic-flux sensitive surface of the hall element 30. With the electric current sensor of the first embodiment, the angle θ is adjusted every 45 degrees because eight recesses are formed around the hole 21. By increasing the number of recesses 22 and teeth 41, the modes for sensing an electric current can be switched at a smaller step size. Consequently, electric current can be sensed without causing the hall element 30 to be saturated.

The sensitivity of the hall element 30 is selected most appropriately so as to be suitable to the range of the electric current that is to be measured. This means that the accuracy of electric current detection is improved. In addition, a wide range of electric current can be detected by allowing the angle θ to be adjusted in accordance with the quantity of the electric current to be measured. As a result, the precision in electric current detection can be improved.

With this arrangement, only a single hall element is used, unlike the prior art technique. Variation in properties among elements can be eliminated, and the manufacturing cast can be reduced.

Second Embodiment

Figure 4:
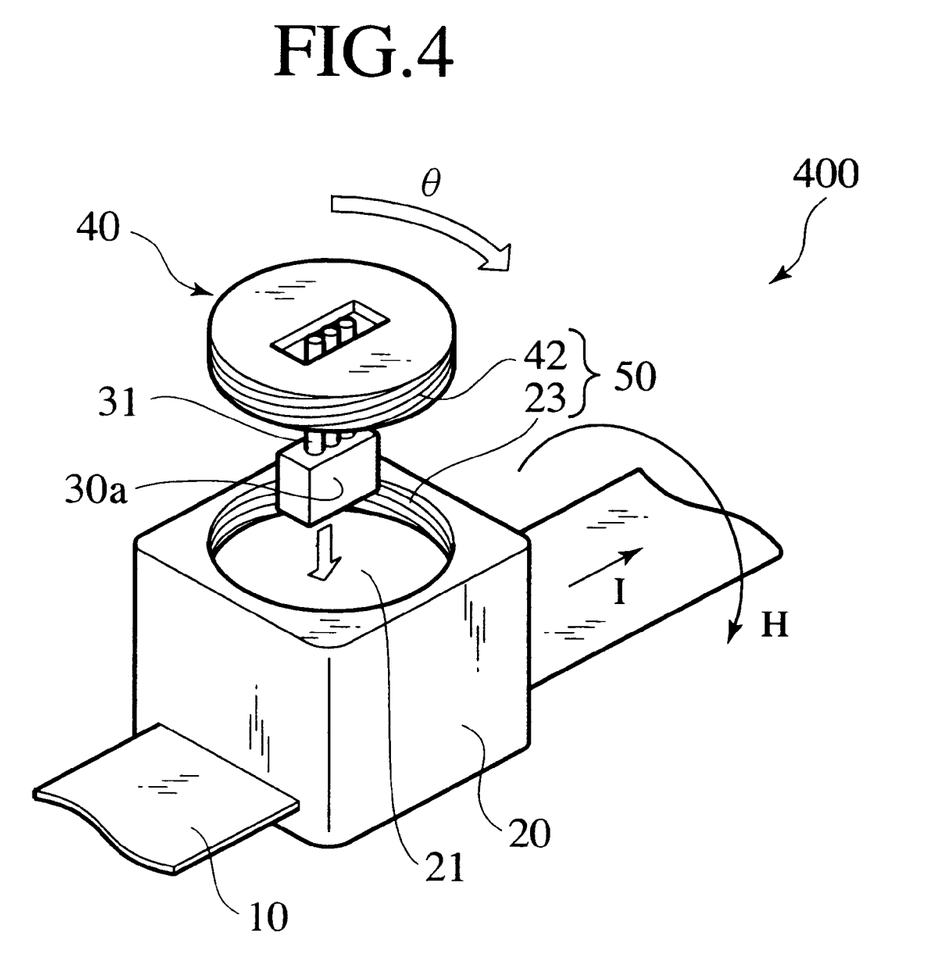
FIG. 4 illustrates in a perspective view of an electric-current sensor according to the second embodiment of the invention.

FIG. 4 illustrates an electric current sensor 400 according to the second embodiment. The electric current sensor 400 includes a junction box 20 and a cock 40. In this embodiment, cock 40 has an external thread 42, and the hole 21 of the junction box 20 has an internal thread 23. The external thread 42 and the internal thread 23 constitute an angle adjusting mechanism 50. Other elements are the same as those in the first embodiment. The same elements are denoted by the same numerical references, and explanation for them will be omitted.

The external thread 42 of the cock 40 is screwed into the hole 21 by rotating the cock 40. The orientation of the hall element 30 is changed in a continuous manner by simply rotating the cock 40. Because the angle between the magnetic-flux sensitive surface and the direction of the magnetic flux induced by the electric current flowing through the conductor is continuously adjusted, the sensitivity of the hall element 30 is selected most appropriately to measure a broad range of electric current.

This arrangement can achieve the same effects as that illustrated in the first embodiment, and can improve the measurement precision, while broadening the measuring range.

Third Embodiment

FIG. 5 illustrates an electric current sensor 500 according to the third embodiment of the invention. The electric current sensor 500 includes a clipping frame 25, and is adapted to measure an electric current flowing through a belt-like conductor 10. One of the advantages of this sensor is that the clipping frame 25 is attached directly to the conductor 10 every time an electric current is sensed.

Figure 5A:
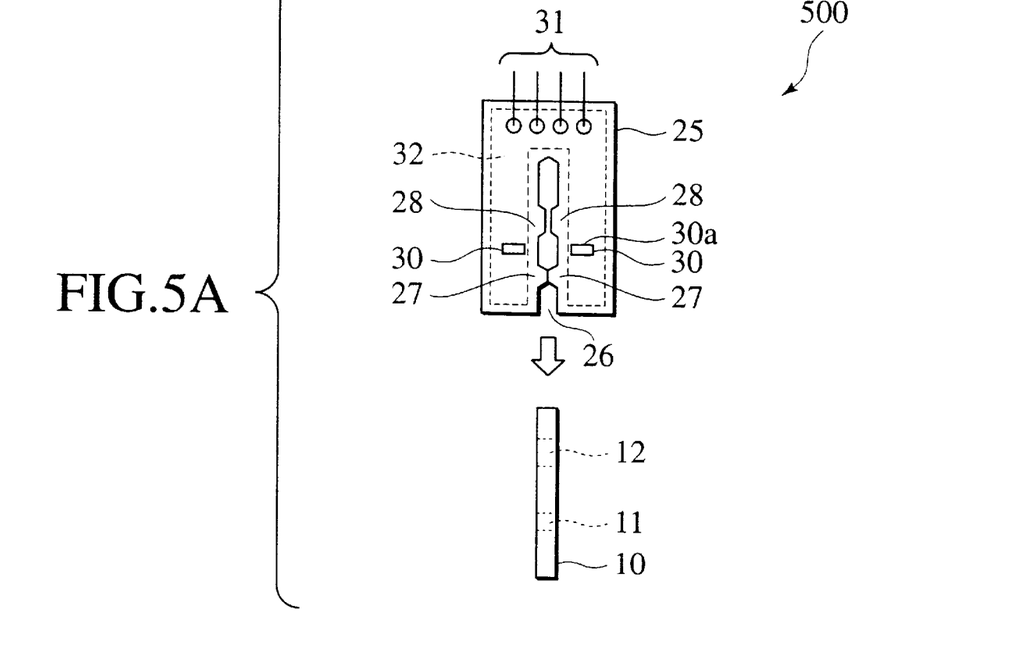
FIG. 5A is a front view.
Figure 5B:
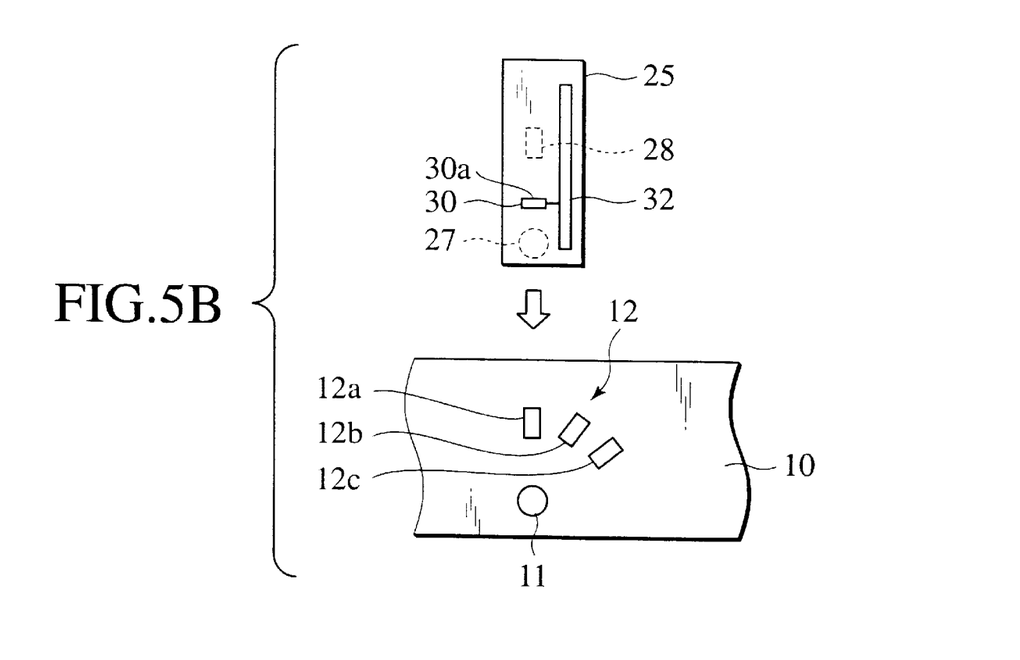
FIG. 5B is a right side view.

The clipping frame 25 has a slit 26 that divides the clipping frame 25 into two wings. Accordingly, the cross-section of the clipping frame 25 is U-shaped, as shown in FIG. 5A. The clipping frame 25 is designed so as to pinch the belt-like conductor 10 when it is attached to the conductor 10. Pinching projections 27 and angle adjusting projections 28 are formed in the opposite inner faces of the slit 26. A substrate 32, on which hall elements 30 are secured, is placed inside the clipping frame 25.

Each hall element 30 is secured to the substrate 32 so that the magnetic-flux sensitive surface 30a of the hall element 30 is perpendicular to the depth direction of the slit 26. A plurality of leads are connected to the end of the substrate 32 in order to supply a prescribed quantity of electric current to the hall elements 30 and extract electric signals produced by the hall elements 30.

The electric current sensor 500 of the third embodiment is adapted to be attached directly to a belt-like conductor 10 to measure the electric current through the conductor (such as a busbar) 10. For this sake, the conductor 10 has a fixing hole 11 and multiple angle-adjusting holes 12 along an arch around the fixing hole 11. In the example shown in FIG. 5B, three angle-adjusting holes 12a, 12b, and 12c are formed in the conductor 10. The three angle-adjusting holes are arranged along an arch that is a portion of a circle about the fixing hole 11. Although, in the third embodiment, three angle-adjusting holes 12a–12c are formed, the number of angle-adjusting holes 12 is arbitrary. The more the angle-adjusting holes 12 is formed, the more precisely the sensitivity of the hall element 30 is adjusted at a smaller step size.

Figure 6A:
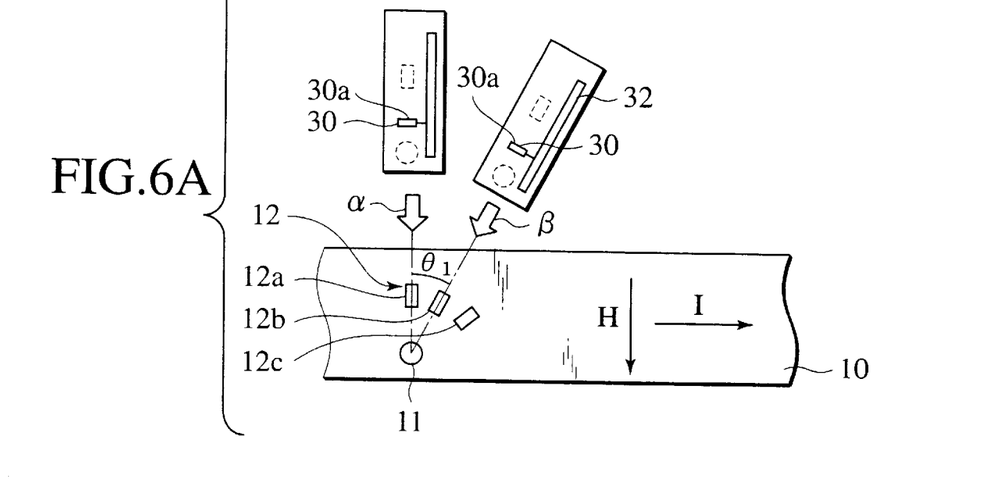
FIG. 6A shows the electric-current sensor being positioned with respect to a conductor.
Figure 6B:
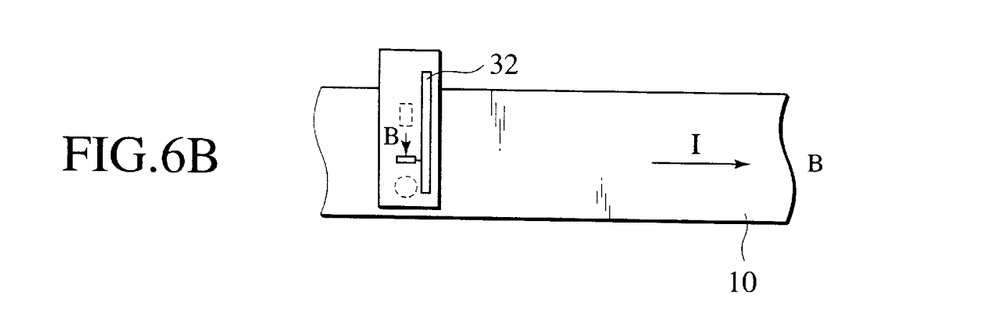
FIG. 6B shows the electric-current sensor secured in a vertical direction, and FIG. 6 shoes the electric-current sensor secured at a predetermined angle with respect to the vertical direction.
Figure 6C:
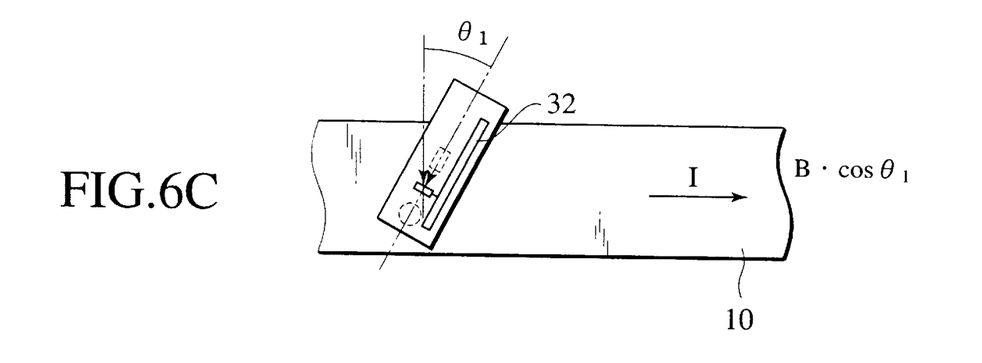
Figure 7:
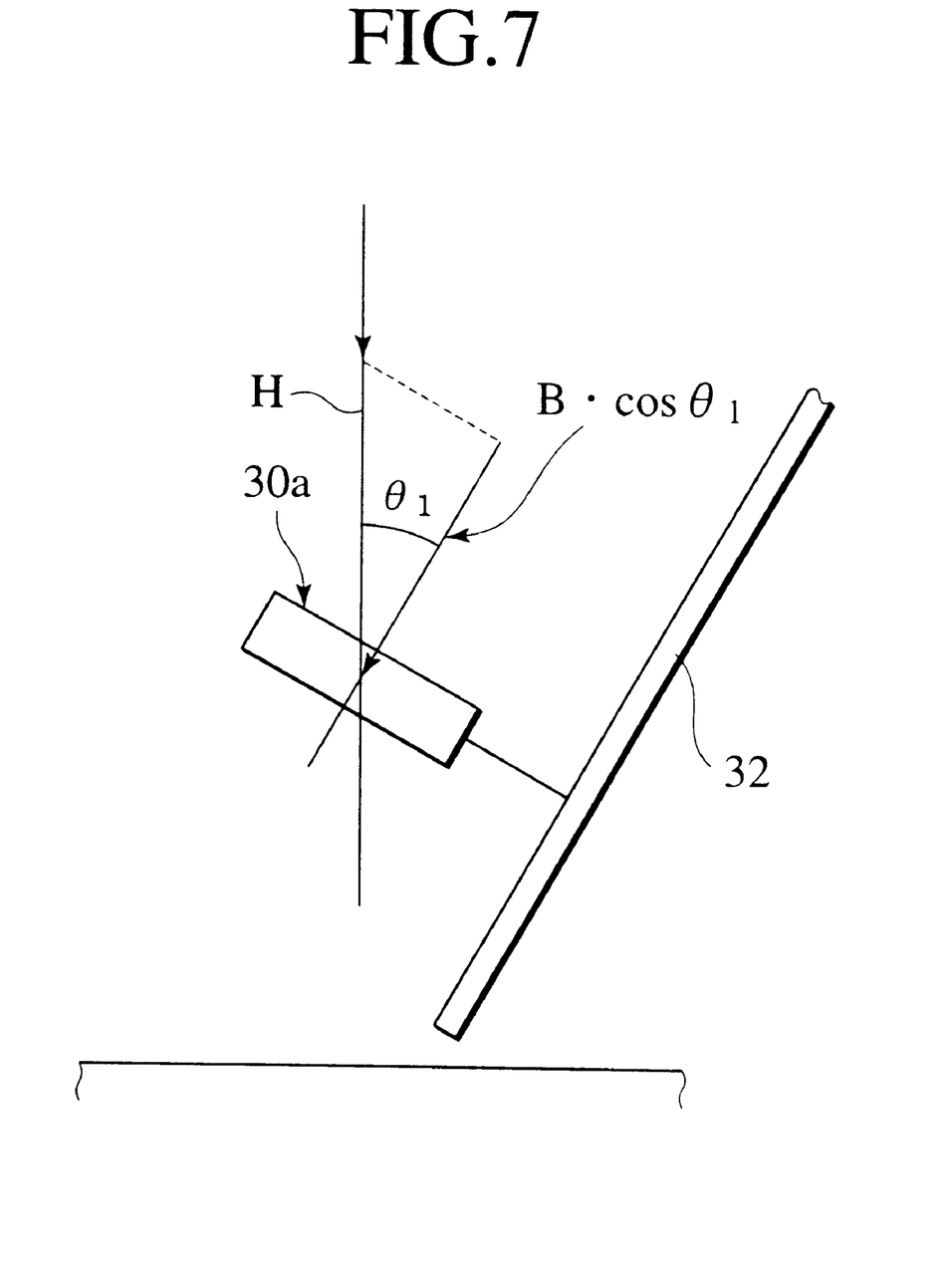
FIG. 7 illustrates the essential part of the electric-current sensor shown in FIG. 6C.

FIGS. 6 and 7 illustrate how the electric current sensor 500 shown in FIG. 5 is used.

First, the electric current sensor 500 is fixed to the conductor at a normal angle with respect to the direction of the electric current flow. The electric current sensor is attached to the conductor 10 in the direction of the arrow α, as shown in FIG. 6A. The belt-like conductor 10 is inserted in the slit 26 of the clipping frame 25.

The fixing projections 27 are fit into the fixing hole 11, and the angle-adjusting projections 28 are fit into the angle adjusting hole 12a. Consequently, the electric current sensor is secured to the conductor 10 at a normal angle with respect to the longitudinal axis of the conductor 10.

In this state, the magnetic-flux sensitive surface 30a extends parallel to the longitudinal axis of the conductor 10 and perpendicular to the surface of the belt-like conductor 10. If an electric current I flows through the conductor 10 in the direction indicated by the arrow in FIG. 6, a magnetic field H whose intensity corresponds to the quantity of electric current I is generated in accordance with the Ampere's corkscrew rule.

Since the electric current sensor 500 is secured to the conductor 10 at a right angle, as shown in FIG. 6B, the magnetic flux induced by the electric current I strike the magnetic-flux sensitive surface 30a of the hall element 30 at a normal angle. Accordingly, the hall element 30 generates an electric signal in proportion to the magnetic flux density B.

Next, the electric current sensor 500 is tilted by θ 1 from the line perpendicular to the longitudinal axis of the conductor 10. In this case, the electric current sensor 500 is attached to the conductor 10 in the direction of the arrow β so that the edge of the belt-like conductor 10 is inserted in the slit 26, as shown in FIG. 6A. The fixing projections 27 are fit into the fixing hole 11, and the angle-adjusting projections 28 are fit into the hole 12b. The angle 12b is positioned in advance so as to make an angle θ 1 with respect to the hole 12a. Thus, the electric current sensor 500 is secured to the belt-like conductor 10 obliquely at an angle θ 1, as shown in FIG. 6C.

The magnetic flux induced by the electric current I flowing through the conductor 10 strike the magnetic-flux sensitive surface 30a of the hall element 30 at an incident angle of θ 1, as shown in the enlarged view of FIG. 7. The magnetic flux density B sensed at the magnetic-flux sensitive surface 30a is B*cos θ 1. Accordingly, the hall element 30 generates an electric signal in proportion to the magnetic flux density of B*cos θ 1.

If the electric current flowing through the belt-like conductor 10 is much larger, the electric current sensor 50 is tilted more, by setting the angle adjusting projections 28 into the hole 12c.

In this manner, the electric current sensor 500 is attached to the conductor 10 at the most appropriate angle in accordance to the quantity of electric current flowing through the conductor 10. Namely, if the electric current I flowing through the conductor 10 is small, the angle adjusting projections 28 are fit into the hole 12a, so that the magnetic-flux sensitive surface of the hall element 30 is normal to the direction of the magnetic flux. As the electric current to be measured becomes large, the angle-adjusting projections 28 are moved to the hole 12b or 12c, thereby adjusting the magnetic flux density sensed at the magnetic-flux sensitive surface. As a result, the electric current can be measured in the most appropriate range without causing the hall elements 30 to be saturated.

In the third embodiment, the angle-adjusting projections 28 of the clipping frame 25 and the holes 12a through 12c of the conductor 10 constitute an angle adjusting mechanism. This arrangement is much simpler than the structures illustrated in the first and second embodiments, and the manufacturing cost is further reduced. In addition, the electric current sensor is much easier to use because it is attached directly to the conductor 10 in a simple manner.

In the third embodiment, the fixing projections 27 and the angle-adjusting projections 28 are formed in the electric current sensor 500, and the holes are formed in advance in the belt-like conductor 10. However, fixing recesses and angle-adjusting recesses may be formed in the electric current sensor 500, and multiple projections, which are to be received in the recesses, may be formed in the belt-like conductor 10. This arrangement can also achieve the same effects and advantages as the structure shown in FIG. 5.

It should be noted that, besides those already mentioned above, many modifications and variations may be made without departing from the novel and advantageous features of the present invention. Such modifications are also included in the scope of the invention defined by the appended claims.

What is claimed is:

1. An electric current sensor for sensing an electric current flowing through a conductor, the electric current inducing magnetic flux about the conductor, the sensor comprising:

a magneto-electric conversion element having a magnetic-flux sensitive surface and being configured to output an electric signal relative to a magnetic flux density at the magnetic-flux sensitive surface;

a junction box for accommodating a portion of the conductor and having a hole on one face; and an angle adjusting mechanism for changing an angle between the magnetic-flux sensitive surface and the direction of the magnetic flux, the angle adjusting mechanism including a cock for supporting the magneto-electric conversion element and configured to fit into the hole of the junction box, the cock being rotatable with respect tot he hole of the junction box, wherein the electric current sensor detects the electric current flowing through the conductor based on the electric signal output from the magneto-electric conversion element whose magnetic-flux sensitive surface is oriented with respect to the magnetic flux at a selected angle.

2. The electric current sensor according to claim 1, wherein:

the hole has a plurality of recesses around its circumference at a predetermined interval, and the cock has a plurality of teeth along its periphery at a predetermined interval; and the angle adjusting mechanism comprises the teeth of the cock and the recesses of the hole which are meshed with and disengaged from each other.

3. The electric current sensor according to claim 1, wherein:

the hole has an internal thread, and the cock has an external thread; and the angle adjusting mechanism comprises the external thread of the cock and the internal thread of the hole.

4. An electric current sensor for sensing an electric current flowing through a conductor, the electric current inducing magnetic flux about the conductor, the sensor comprising:

a magneto-electric conversion element having a magnetic-flux sensitive surface and being configured to output an electric signal relative to a magnetic flux density at the magnetic-flux sensitive surface;

an angle adjusting mechanism for changing an angle between the magnetic-flux sensitive surface and the direction of the magnetic flux, wherein the electric current sensor measures the electric current flowing through the conductor based on the electric signal output from the magneto-electric conversion element whose magnetic-flux sensitive surface is oriented with respect to the magnetic flux at a selected angle.

5. The electric current sensor according to claim 4, further comprising a cock for supporting the magneto-electric conversion element, wherein:

a portion of the cock functions as a part of the angle adjusting mechanism; and the magneto-electric conversion element is supported by the cock so that the magnetic-flux sensitive surface is oriented at a predetermined angle with respect to the direction of the magnetic flux induced by the electric current flowing through the conductor.

6. The electric current sensor according to claim 1, further comprising a clipping frame having a slit and two wings separated by the slit, the conductor being inserted in the slit and pinched by the two wings, wherein the magneto-electric conversion element is a pair of hall elements placed inside the respective wings of the clipping frame, each hall element having a magnetic-flux sensitive surface.

7. The electric current sensor according to claim 6, wherein:

a pair of angle-adjusting projections are formed in the inner faces of the slit, and a plurality of angle-adjusting holes are formed in the conductor at a predetermined interval along an arch, the pair of angle-adjusting projections being fit into one of the angle-adjusting holes; and the pair of angle-adjusting projections and the plurality of holes constitute the angle adjusting mechanism.

8. The electric current sensor according to claim 6, wherein:

a pair of angle-adjusting recesses are formed in the inner faces of the slit, and a plurality of angle-adjusting projections are formed on the conductor at a predetermined interval along an arch, one of the angle-adjusting projections being fit into the angle-adjusting recesses; and the pair of angle-adjusting recesses and the plurality of angle-adjusting projections constitute the angle adjusting mechanism.

9. A method for sensing an electric current flowing through a conductor, the electric current inducing magnetic flux about the conductor, the method comprising the steps of:

placing a magneto-electric conversion element in the magnetic flux, the magneto-electric conversion element having a magnetic-flux sensitive surface;

adjusting the orientation of the magnetic-flux sensitive surface with respect to the direction of the magnetic flux;

causing the magneto-electric conversion element to output an electric signal relative to a magnetic flux density sensed at the magnetic-flux sensitive surface; and measuring the electric current flowing through the conductor based on the electric signal output generated from the magneto-electric conversion element.

* * * * *